United States Patent
Marchack et al.

(10) Patent No.: US 10,305,029 B1
(45) Date of Patent: May 28, 2019

(54) IMAGE REVERSAL PROCESS FOR TIGHT PITCH PILLAR ARRAYS

(71) Applicants: International Business Machines Corporation, Armonk, NY (US); ZEON Corporation, Tokyo (JP)

(72) Inventors: Nathan P. Marchack, New York, NY (US); Sebastian U. Engelmann, White Plains, NY (US); Masahiro Nakamura, Eastchester, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/809,363

(22) Filed: Nov. 10, 2017

(51) Int. Cl.
| | |
|---|---|
| *H01L 27/22* | (2006.01) |
| *H01L 43/12* | (2006.01) |
| *H01L 21/311* | (2006.01) |
| *H01L 43/02* | (2006.01) |
| *H01L 43/08* | (2006.01) |

(52) U.S. Cl.
CPC ........ *H01L 43/12* (2013.01); *H01L 21/31116* (2013.01); *H01L 21/31144* (2013.01); *H01L 27/222* (2013.01); *H01L 43/02* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 6,221,562 | B1 | 4/2001 | Boyd et al. |
| 6,358,856 | B1 | 3/2002 | Lyons et al. |
| 8,084,186 | B2 | 12/2011 | Abdallah et al. |
| 9,214,355 | B2 | 12/2015 | Engelmann et al. |
| 9,490,164 | B1 | 11/2016 | Engelmann et al. |
| 9,490,168 | B1 | 11/2016 | Chen et al. |
| 9,520,395 | B2 | 12/2016 | Bouche et al. |
| 2003/0082906 | A1 | 5/2003 | Lammert |

(Continued)

FOREIGN PATENT DOCUMENTS

| | | |
|---|---|---|
| CN | 102633230 A | 8/2012 |
| KR | 20090066814 A | 6/2009 |

OTHER PUBLICATIONS

"Method and System for Transferring Sidewall Image Patterns by using Underlayer Etch", IP.com, IP Disclosure No. IPCOM000215099D, Feb. 17, 2012, 6 pages.

(Continued)

*Primary Examiner* — Asok K Sarkar
(74) *Attorney, Agent, or Firm* — L. Jeffrey Kelly; Ryan, Mason & Lewis, LLP

(57) ABSTRACT

Fabrication of a semiconductor device includes providing a semiconductor substrate, and a dielectric layer disposed over the semiconductor substrate. The dielectric layer includes a plurality of vias extending through the dielectric layer to the top surface of the semiconductor substrate. Each of the vias contains an organic planarization material. The dielectric layer is removed by plasma etching with a gas having a general chemical formula of $C_xH_yF_z$ wherein x is greater than 3 and y is greater than z to provide an array of pillars including the organic planarization material on the semiconductor substrate.

20 Claims, 4 Drawing Sheets

(56) References Cited

U.S. PATENT DOCUMENTS

| | | | |
|---|---|---|---|
| 2009/0191367 A1* | 7/2009 | Chen | B82Y 10/00 |
| | | | 428/34.1 |
| 2010/0203299 A1 | 8/2010 | Abdallah et al. | |
| 2016/0079242 A1 | 3/2016 | Bouche et al. | |
| 2016/0336225 A1 | 11/2016 | Chen et al. | |
| 2017/0062707 A1* | 3/2017 | Annunziata | H01L 43/12 |
| 2017/0103889 A1 | 4/2017 | Chan et al. | |
| 2017/0243756 A1 | 8/2017 | Matsuura | |

OTHER PUBLICATIONS

Bassous et al., "Triple Layer System for High Resolution Microlithography", IP.com, IP Disclosure No. IPCOM00004570D, Feb. 7, 2005, 4 pages.

* cited by examiner

IMAGE REVERSAL PROCESS FOR TIGHT PITCH PILLAR ARRAYS

BACKGROUND

The present invention relates to semiconductor processing; and more particularly to a method of etching a dielectric with minimal organic mask.

Pillar arrays are an increasingly desired geometric configuration for upcoming technologies such as, for example, spin-transfer torque magnetoresistive random access memory (STT-MRAM). However, there are many challenges involved in directly patterning pillars, such as collapse at high aspect ratios and control of critical dimensions (CD) and sidewall angles. The use of image reversal process flows to form pillars from hole (via) arrays can improve fidelity due to the higher structural integrity of hole arrays, however, the hole array is often formed in a carbon-based material in order to facilitate removal by ashing chemistries, e.g., in downstream plasmas or through wet chemistries. As these chemistries have a significant isotropic etch component, this has negative implications for transferring patterns at very tight pitches.

There is thus a need to provide a process that will directly pattern pillars using entirely plasma etch processes designed to be largely anisotropic, which offer better control of CD and sidewall angles than wet etch patterning or predominantly isotropic plasma etch conditions.

SUMMARY

Embodiments described herein provide methods of forming semiconductor devices.

For example, in one exemplary embodiment, a method for fabricating a semiconductor device, the method comprising providing a semiconductor substrate, a dielectric layer disposed over the semiconductor substrate, the dielectric layer comprising a plurality of vias extending through the dielectric layer to the top surface of the semiconductor substrate, wherein each via contains an organic planarization material. The dielectric layer is removed by plasma etching with a gas having a general chemical formula of $C_xH_yF_z$ wherein x is greater than 3 and y is greater than z to provide an array of pillars comprising the organic planarization material on the semiconductor substrate.

These and other features, objects and advantages of the present invention will become apparent from the following detailed description of illustrative embodiments thereof, which is to be read in connection with the accompanying drawings.

DETAILED DESCRIPTION

Embodiments will now be described in further detail with regard to methods for an image reversal process for forming tight pitch pillar arrays.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

An illustrative embodiment for forming tight pitch pillar arrays on a semiconductor substrate using a selective gas etching process will be described below with reference to FIGS. 1-9.

Figure 1:
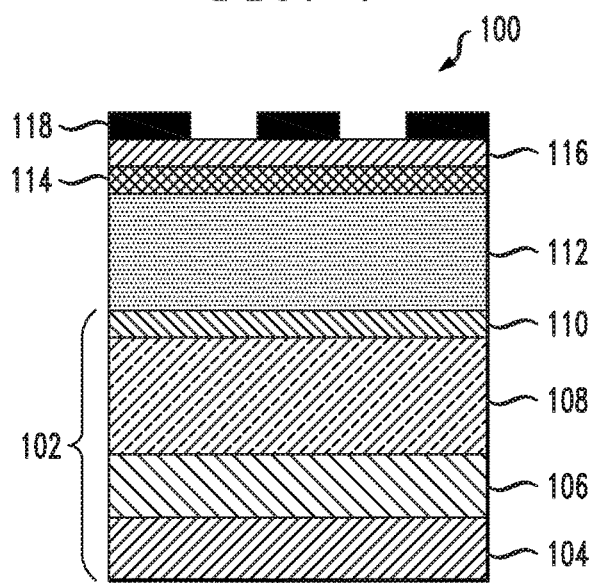
FIG. 1 is a schematic cross-sectional side view of a semiconductor device illustrating a first processing step in forming tight pitch pillar arrays, according to an embodiment of the invention.

For example, FIG. 1 illustrates a schematic cross-sectional side view of a semiconductor device 100 illustrating a first processing step in forming tight pitch pillar arrays. For the purpose of clarity, several fabrication steps leading up to the production of semiconductor device 100 having substrate 102 as illustrated in FIG. 1 are omitted. In other words, semiconductor device 100 having substrate 102 does not necessarily start out in the form illustrated in FIG. 1, but may develop into the illustrated structure over one or more well-known processing steps which are not illustrated but are well-known to those of ordinary skill in the art.

The semiconductor device 100 comprises a substrate 102. The substrate 102 may comprise a semiconductor material layer 104 including, but not limited to, Si, SiGe, SiC, SiGeC, III-V, II-VI compound or other like. In one embodiment, substrate 102 may comprise only a semiconductor material layer 104. In another embodiment, multiple layers can be used to form the substrate 102. For example, as illustrated in FIG. 1, metal layer 106 is deposited over semiconductor material layer 104. In one embodiment, metal layer 106 is deposited via, for example, atomic layer deposition (ALD). As is known in the art, ALD is a thin film deposition technique. ALD is performed by exposing separate gaseous precursors to the surface of the material. In contrast to chemical vapor deposition (CVD), in which gaseous precursors are present simultaneously in the reactor, ALD is performed as a series of sequential, non-overlapping pulses. Repeated exposure of the chemical precursors to the surface result in the deposition of the thin film. Specific details regarding the ALD process, including specific details regarding types of gaseous precursors that may be utilized in accordance with the embodiments described herein, are known in the art, and a further description thereof will not be provided.

Hard mask layer 108 is then deposited over, and in contact with, metal layer 106. Hard mask layer 108 can be formed from any hard mask material such as a nitride hard mask material comprising, for example, TiN, TaN, WN, BN, a combination thereof, or a stack thereof. Metal layer 106 can be formed from layers comprising, for example, Ti, Hf, TiN or Al. In one embodiment, metal layer 106 can be a non-volatile memory cell material, e.g., alloys such as CoFeB, NiPt, or phase change materials such as GeSbTe (i.e., germanium/antimony/tellurium).

Dielectric layer 110 is deposited over, and in contact with, hard mask layer 108. Dielectric layer 110 may be formed of any suitable dielectric material such as, for example, an oxide material, (e.g., tetraethyl orthosilicate (TEOS)). Deposition of dielectric layer 110 may be performed by methods well known in the art, in particular by atomic layer deposition (ALD) or generally any other suitable methods such as chemical vapor deposition (CVD) or Physical Vapor Deposition (PVD) methods.

Dielectric layer 112 is deposited over, and in contact with, substrate 102. Deposition of dielectric layer 112 may also be performed by methods well known in the art as with dielectric layer 110, such as ALD, CVD or PVD methods. Dielectric layer 112 is an SiN layer.

A double mask layer including organic planarization layer (OPL) 114 and a silicon-containing anti-reflective coating (SiARC) layer 116 is formed over, and in contact with, dielectric layer 112. The OPL can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL can include a transparent organic polymer. The OPL can be a standard CxHy polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. The OPL and SiARC layers 114 and 116 can be applied, for example, by spin-coating.

In one embodiment, SiARC layer 114 can have a thickness ranging from about 20 to about 70 nanometers (nm). In one embodiment, OPL layer 116 can have a thickness ranging from about 60 to about 100 nm.

Next, photoresist 118 is formed onto the SiARC layer 116 in order to pattern the SiARC/OPL layers 116/114. Photoresist 118 is deposited onto SiARC layer 116 and is lithographically patterned to form a plurality of openings therein.

Figure 2:
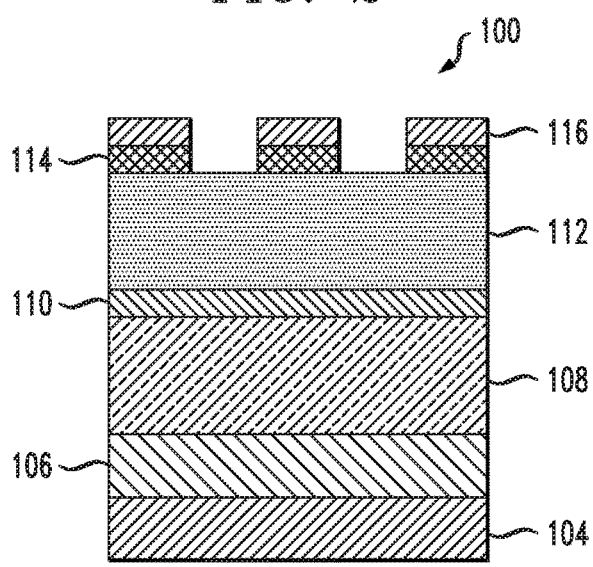
FIG. 2 is a schematic cross-sectional side view of a semiconductor device illustrating a second processing step in forming tight pitch pillar arrays, according to an embodiment of the invention.

FIG. 2 illustrates the semiconductor structure 100 having a plurality of openings in the SiARC/OPL layers 116/114 and to the top surface of dielectric layer 112 after etching. The SiARC and OPL layers can be patterned using known plasma etch chemistries such as, for example, $CF_4/CHF_3$ and $N_2/O_2/H_2$ respectively. The photoresist is removed in the process of etching the OPL layer as shown in FIG. 2. This prepares the structure for the reverse image processing beginning with forming vias 120 in the dielectric layer 112 as shown in FIG. 3.

Figure 3:
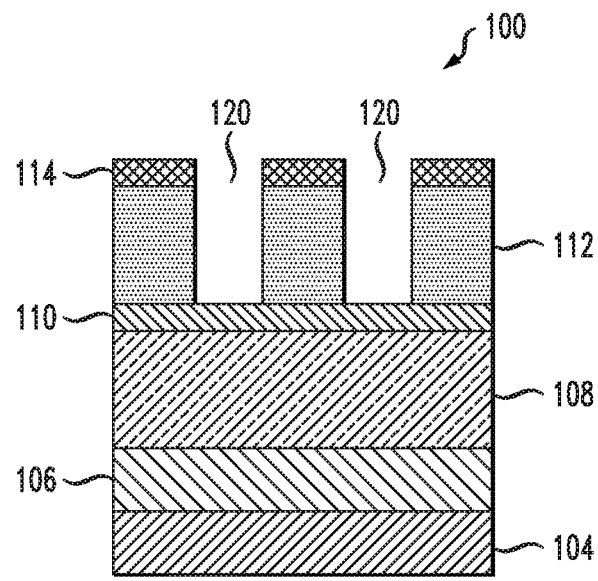
FIG. 3 is a schematic cross-sectional side view of a semiconductor device illustrating a third processing step in forming tight pitch pillar arrays, according to an embodiment of the invention.

As illustrated in FIGS. 2 and 3, the plurality of openings and vias 120 may be formed by plasma etching with a highly selective gas chemistry in the plasma etch to allow for patterning the dielectric layer 112 with the use of minimal organic mask. The SiARC layer 116 is selectively removed as shown in FIG. 3 following formation of the plurality of vias 120 in the dielectric layer 112 and exposing the top surface of substrate 102. For example, the general formulation for a highly selective gas chemistry is $C_xH_yF_z$ (where x>3 and y>z), herein also referred to as high C/F ratio chemistry (e.g., with sufficient oxygen addition). One example of such high C/F ratio chemistry is $C_4H_9F$. Such gases behave differently under plasma conditions (both continuous wave (CW) mode and pulsed mode) than conventional $CF_x/CH_xF_y$ chemistries as the dissociation is overall much lower and, thus, the etch and polymerization process is generally driven by molecular radicals, not ions. In one embodiment, the plurality of openings and vias 120 may be formed by plasma etching with the highly selective gas chemistry in the absence of plasma pulsing. In another embodiment, the plurality of openings and vias 120 may be formed by plasma etching with a highly selective gas chemistry using plasma pulsing.

In one embodiment, the highly selective gas chemistry having a general chemical formula of $C_xH_yF_z$ (where x>3 and y>z) is used to create a plasma discharge using the follow parameters: a source power ranging from about 100 to about 500 W, a bias power ranging from about 20 to about 100 W, and a pressure ranging from about 5 to about 60 mTorr. The plasma source can be one of the following plasmas: (i) an electron cyclotron resonance (ECR) plasma; (ii) a helicon wave plasma; (iii) a radio-frequency (RF) inductively coupled plasma (ICP); and (iv) a capacitively coupled plasma (CCP). In another embodiment when the ICP source is used, radio-frequency pulsing can be employed with any combination of the source and bias power generators as follows: (i) source pulsing; (ii) bias pulsing; or (iii) synchronous pulsing, the pulsing being with or without a time delay between the bias pulsing and the source pulsing. Typical parameters of the pulsed plasma are a duty cycle ranging from 40% to 100%, and a pulsing frequency ranging from 1 KHz to 2 KHz.

Figure 4:
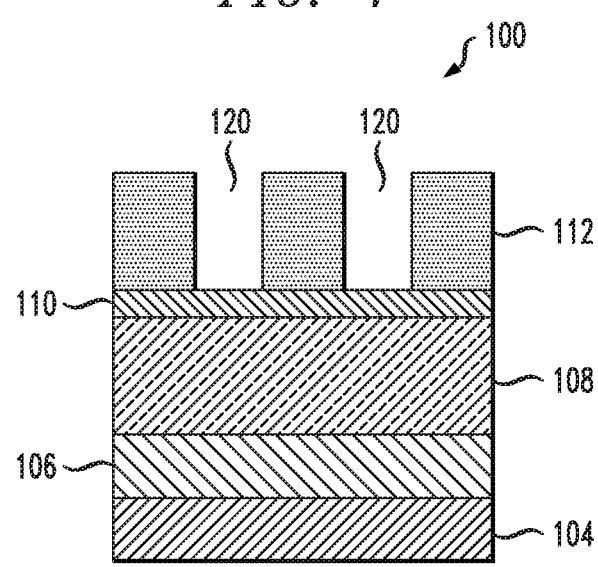
FIG. 4 is a schematic cross-sectional side view of a semiconductor device illustrating a fourth processing step in forming tight pitch pillar arrays, according to an embodiment of the invention.
Figure 5:
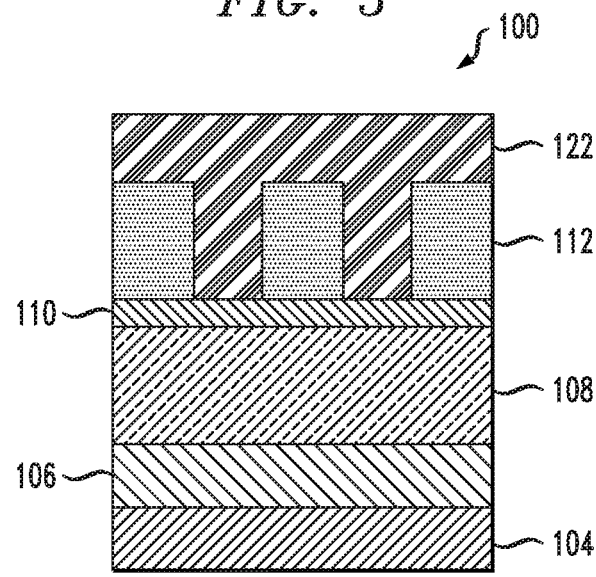
FIG. 5 is a schematic cross-sectional side view of a semiconductor device illustrating a fifth processing step in forming tight pitch pillar arrays, according to an embodiment of the invention.

Next, OPL layer 114 is selectively removed as shown in FIG. 4, using a conventional chemistry etch such as $N_2/O_2/H_2$. OPL layer 122 is then deposited over dielectric layer 112 and in vias 120 by, for example, by spin-coating, as shown in FIG. 5. OPL layer 122 can be the same or different material as discussed above for OPL 114.

Figure 6:
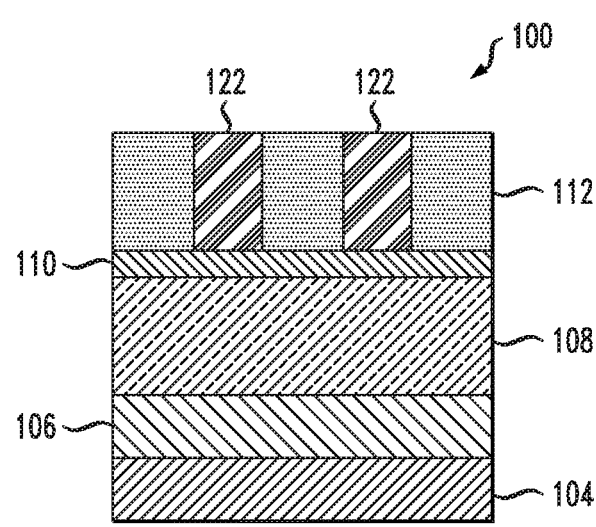
FIG. 6 is a schematic cross-sectional side view of a semiconductor device illustrating a sixth processing step in forming tight pitch pillar arrays, according to an embodiment of the invention.

Once OPL 122 is deposited over dielectric layer 112 and in vias 120, OPL 122 is etched to selectively remove OPL 122 to expose the top surface of dielectric layer 112 and leave the plurality of vias 120 filled with OPL 122, as shown in FIG. 6. The OPL 122 can be etched using plasma chemistries known in the literature, e.g., $N_2/O_2/H_2$, however the bias power can be reduced or turned off completely to maximize OPL retention in the vias. Thus, dielectric layer 112 and OPL 122 are at a uniform height. It is to be understood that by "uniform" herein, it is intended to comprise exactly uniform and approximately or substantially uniform.

Figure 7:
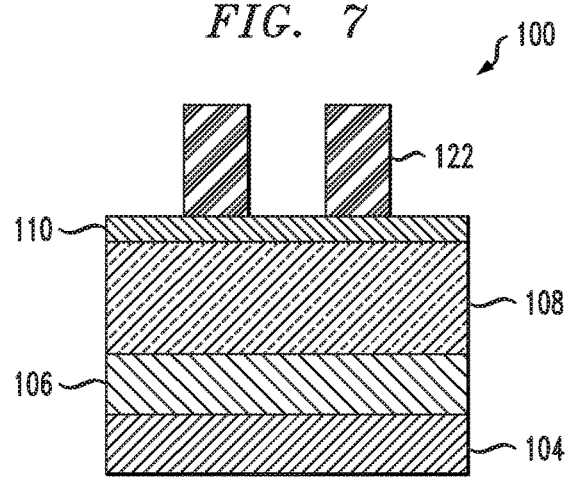
FIG. 7 is a schematic cross-sectional side view of a semiconductor device illustrating a seventh processing step in forming tight pitch pillar arrays, according to an embodiment of the invention.

Following the filling of the vias, the remaining dielectric layer 112 is selectively removed by plasma etching with a highly selective gas chemistry in the plasma etch leaving OPL pillars 122 behind in the filled vias, as shown in FIG. 7. The plasma etching with the highly selective gas chemistry can be as discussed above where the general formulation for a highly selective gas chemistry according to the present invention is $C_xH_yF_z$ (where x>3 and y>z), herein also referred to as high C/F ratio chemistry (e.g., with sufficient oxygen addition).

Figure 8:
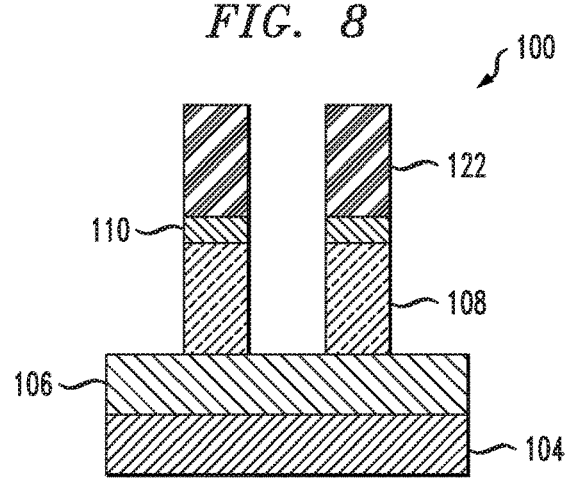
FIG. 8 is a schematic cross-sectional side view of a semiconductor device illustrating an eighth processing step in forming tight pitch pillar arrays, according to an embodiment of the invention.
Figure 9:
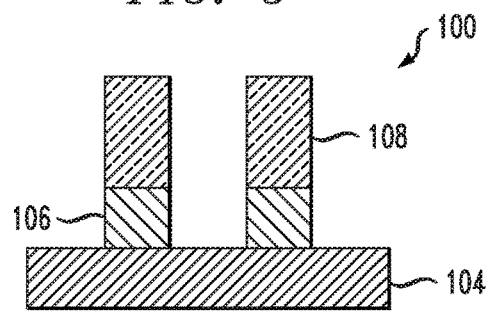
FIG. 9 is a schematic cross-sectional side view of a semiconductor device illustrating a ninth processing step in forming tight pitch pillar arrays, according to an embodiment of the invention.

The OPL pillars 122 can then be used as masks for further processing of the semiconductor structure 100 as shown in FIGS. 8 and 9. For example, the dielectric layer 110 and hard mask 108 can be selectively removed from the semiconductor structure 100 leaving an array of pillars comprising OPL 122, dielectric layer 110 and hard mask layer 108 on the top surface of metal layer 106 as shown in FIG. 8. After etching, OPL 122 and dielectric layer 110 are removed and then metal layer 106 is selectively removed by methods known in the art leaving an array of pillars of hard mask layer 108 and metal layer 106 on the top surface of layer 104, as shown in FIG. 9.

The remaining semiconductor structure 100 can then be subjected to any conventional methods for a resulting semiconductor device as known in the art. For example, the array of pillars of hard mask layer 108 and metal layer 106 as shown in FIG. 9 can be of a magnetic memory cell which are then formed into magnetic random access memory (MRAM) devices as illustrated in U.S. Pat. No. 9,490,164.

Advantageously, the methods of patterning described herein provide improved pattern fidelity wherein it is easier to control hole CD and spacing, and wherein the holes will not collapse at high aspect ratios. Further, back-end-of-line (BEOL) compatible materials, such as OPL and SiN may be utilized, wherein the use of OPL allows for ease of coating and conformality in small CD, tight pitch features. Advantageously, the illustrated steps can be carried out using dry etch processes only.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor device, the method comprising:
providing a semiconductor substrate, a first dielectric layer disposed over the semiconductor substrate, the first dielectric layer comprising a plurality of vias extending through the first dielectric layer to the top surface of the semiconductor substrate, wherein each via contains an organic planarization material; and
removing the first dielectric layer by plasma etching with a gas having a general chemical formula of $C_xH_yF_z$ wherein x is greater than 3 and y is greater than z to provide an array of pillars comprising the organic planarization material on the semiconductor substrate.

2. The method of claim 1, wherein the first dielectric layer comprises SiN.

3. The method of claim 2, wherein the organic planarization material comprises carbon, hydrogen, and oxygen.

4. The method of claim 1, wherein the gas having the chemical formula of $C_xH_yF_z$ is $C_4H_9F$.

5. The method of claim 1, wherein the step of removing the first dielectric layer comprises introducing the gas having the chemical formula of $C_xH_yF_z$ into a pulsed plasma; creating an etch chemistry in the pulsed plasma, the etch chemistry including: (i) the gas $C_xH_yF_z$, (ii) molecular radicals generated by dissociation of the gas in the pulsed plasma that dominate the etch chemistry, (iii) atomic radicals generated by dissociation of the gas in the pulsed plasma, (iv) ions generated from the gas in the pulsed plasma, and (v) electrons generated from the gas in the pulsed plasma; and performing etching on a material to be etched.

6. The method of claim 5, wherein the pulsed plasma is one of (i) an electron cyclotron resonance plasma; (ii) a helicon wave plasma; (iii) a radio-frequency inductively coupled plasma; and (iv) a capacitively coupled plasma.

7. The method of claim 6, wherein the radio-frequency inductively coupled plasma is one of a pulsing that follows:

(i) a source pulsing; (ii) a bias pulsing; and (iii) a synchronous pulsing, the pulsing being with or without a time delay between the bias pulsing and the source pulsing.

8. The method of claim 5, wherein the pulsed plasma has a duty cycle ranging from 40% to 100%.

9. The method of claim 5, wherein the pulsed plasma has a pulsing frequency ranging from 1 KHz to 2 KHz.

10. The method of claim 5, wherein the pulsed plasma has a source power ranging from about 100 to about 500 W, a bias power ranging from about 20 to about 100 W, and a pressure ranging from about 5 to about 60 mTorr.

11. The method of claim 1, further comprising forming the semiconductor structure into a magnetic random access memory (MRAM) device.

12. The method of claim 1, wherein the semiconductor substrate comprises:
a semiconductor material layer;
a metal layer formed on the semiconductor material layer;
a hard mask layer formed on the metal layer; and
a second dielectric layer formed on the metal layer.

13. The method of claim 12, wherein the first dielectric layer comprises SiN and the second dielectric layer comprises TEOS.

14. The method of claim 13, wherein the organic planarization material comprises carbon, hydrogen, and oxygen.

15. The method of claim 14, wherein the gas having the chemical formula of $C_xH_yF_z$ is $C_4H_9F$.

16. The method of claim 14, wherein the step of removing the first dielectric layer comprises introducing the gas having the chemical formula of $C_xH_yF_z$ into a pulsed plasma; creating an etch chemistry in the pulsed plasma, the etch chemistry including: (i) the gas $C_xH_yF_z$, (ii) molecular radicals generated by dissociation of the gas in the pulsed plasma that dominate the etch chemistry, (iii) atomic radicals generated by dissociation of the gas in the pulsed plasma, (iv) ions generated from the gas in the pulsed plasma, and (v) electrons generated from the gas in the pulsed plasma; and performing etching on a material to be etched.

17. The method of claim 13, wherein the hard mask layer comprises a nitride hard mask.

18. The method of claim 12, further comprising the step of:
selectively removing the hard mask layer and the second dielectric layer to provide an array of pillars comprising the organic planarization material, the second dielectric layer and the hard mask layer on a top surface of the metal layer.

19. The method of claim 18, further comprising the steps of:
removing the organic planarization material and the second dielectric layer from the array of pillars; and
selectively removing the metal layer to provide an array of pillars comprising the hard mask layer and the metal layer on a top surface of the semiconductor material layer.

20. The method of claim 12, further comprising forming the semiconductor structure into a MRAM device.

* * * * *